(12) United States Patent
Chen et al.

(10) Patent No.: US 9,595,323 B1
(45) Date of Patent: Mar. 14, 2017

(54) WORD LINE COMPENSATION FOR MEMORY ARRAYS

(71) Applicant: SanDisk 3D LLC, Milpitas, CA (US)

(72) Inventors: Yingchang Chen, Cupertino, CA (US); Jeffrey Koonyee Lee, Fremont, CA (US); Chang Siau, Saratoga, CA (US); Anurag Nigam, San Jose, CA (US); Thomas Yan, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/015,672

(22) Filed: Feb. 4, 2016

(51) Int. Cl.
G11C 11/16 (2006.01)
G11C 13/00 (2006.01)

(52) U.S. Cl.
CPC .......... *G11C 13/0023* (2013.01); *G11C 11/16* (2013.01)

(58) Field of Classification Search
CPC ................................. G11C 11/16; G11C 11/15
USPC .................................................. 365/148, 158
See application file for complete search history.

(56) References Cited

U.S. PATENT DOCUMENTS

| | | | | |
|---|---|---|---|---|
| 2002/0048185 A1* | 4/2002 | Thewes | ................... | G11C 11/16 365/158 |
| 2002/0175357 A1* | 11/2002 | Kim | ...................... | B82Y 10/00 257/296 |
| 2010/0165711 A1* | 7/2010 | Lee | ..................... | G11C 13/0004 365/163 |
| 2010/0290272 A1* | 11/2010 | Yoon | .................. | G11C 13/0004 365/163 |
| 2011/0069533 A1* | 3/2011 | Kurosawa | ................ | G11C 8/12 365/148 |
| 2013/0100743 A1* | 4/2013 | Lue | ........................ | G11C 16/04 365/185.18 |
| 2015/0332760 A1* | 11/2015 | Kim | ...................... | G11C 13/0004 711/125 |
| 2016/0019961 A1* | 1/2016 | Ratnam | ................ | G11C 13/004 365/148 |
| 2016/0019980 A1* | 1/2016 | Jeong | ................... | G11C 11/5607 365/148 |
| 2016/0020254 A1* | 1/2016 | Park | .................... | H01L 45/1253 257/329 |
| 2016/0064650 A1* | 3/2016 | Wang | ................... | H01L 27/228 257/427 |
| 2016/0133324 A1* | 5/2016 | Alrod | ................. | G11C 13/0097 365/148 |
| 2016/0170682 A1* | 6/2016 | Bakshi | ................. | G06F 3/0649 711/103 |

* cited by examiner

*Primary Examiner* — Michael Tran
(74) *Attorney, Agent, or Firm* — Vierra Magen Marcus LLP

(57) ABSTRACT

A method is provided for operating a non-volatile storage system that includes a plurality of bit lines, a word line comb including a plurality of word lines, and a plurality of memory elements, each memory element coupled between one of the bit lines and one of the word lines. The method includes receiving a current conducted by the word line comb, estimating a resistance of a conductive path between the word line comb and a selected word line voltage node, and generating a voltage at the selected word line voltage node based on the received current and the estimated resistance so that a voltage of the word line comb substantially equals a reference voltage.

20 Claims, 13 Drawing Sheets

Programming

WORD LINE COMPENSATION FOR MEMORY ARRAYS

BACKGROUND

The present disclosure relates to technology for non-volatile storage.

One example of non-volatile memory uses resistance-switching memory elements that may be set to either a low resistance state or a high resistance state. The variable resistance memory elements may be individually connected between two conductors (e.g., a bit line electrode and a word line electrode). The state of such a memory element is typically changed by voltages being placed on the intersecting conductors.

In recent years, non-volatile memory arrays have been proposed that use resistance-switching memory elements without selection devices. Such memory arrays present numerous design and process challenges.

DETAILED DESCRIPTION

Figure 1:
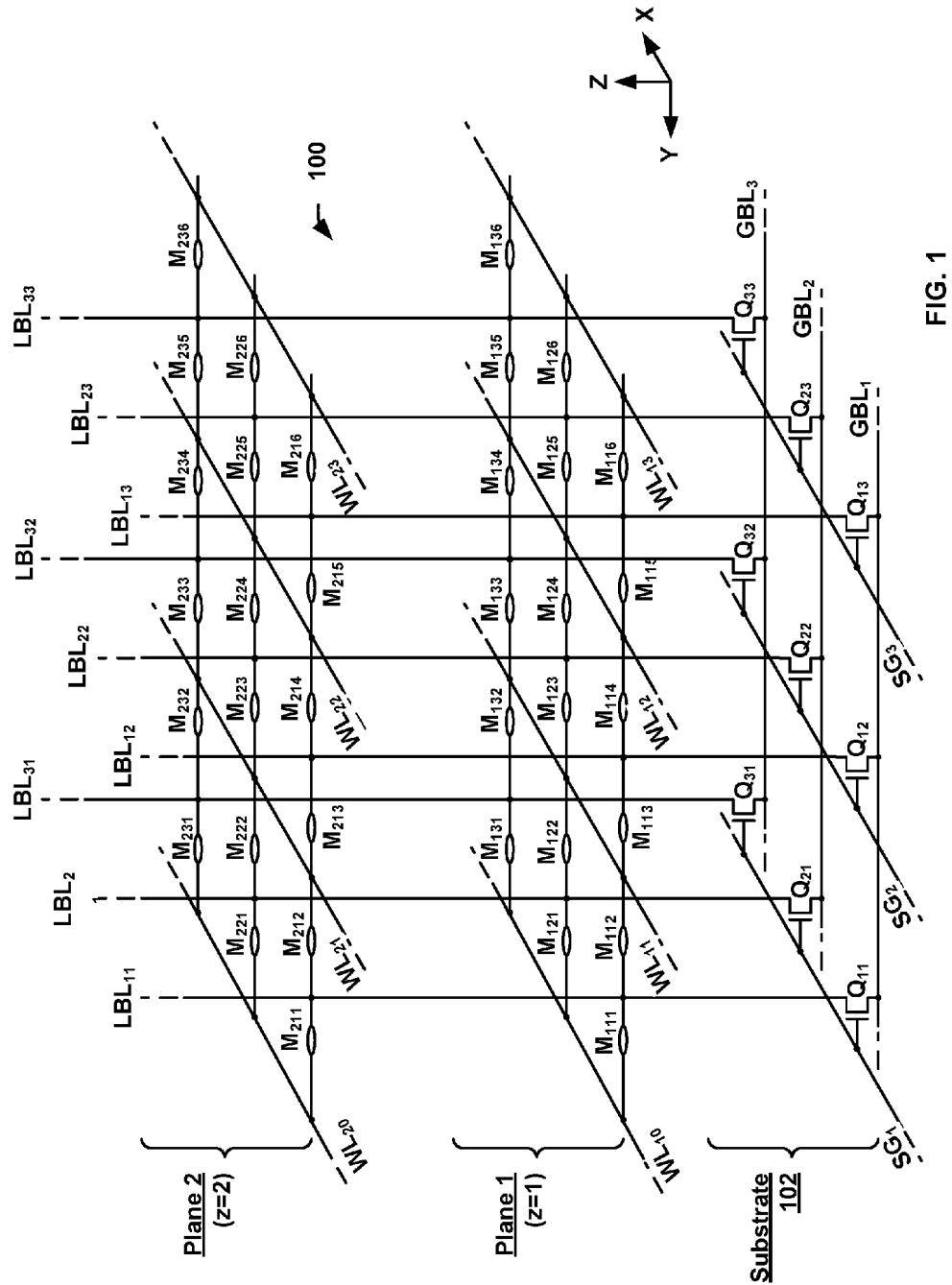
FIG. 1 is an equivalent circuit of a portion of an example three-dimensional array of resistance-switching memory elements, wherein the array has vertical bit lines.

Technology is described for setting word line comb voltages and currents to compensate for voltage drops along conductors coupled between the word line comb and a selected word line voltage node.

In a current sensing embodiment, a current conducted by a word line comb is received, a resistance of a conductive path between the word line comb and a selected word line voltage node is estimated, and a voltage at the selected word line voltage node is generated based on the received current and the estimated resistance so that a voltage of the word line comb substantially equals a reference voltage.

In a voltage sensing embodiment, a a voltage feedback signal is received that substantially equals a voltage of a node coupled to the word line comb. A current conducted by the word line comb is regulated so that the node voltage substantially equals a reference voltage.

A cross-point memory array includes memory elements (also referred to herein as "memory cells") that are placed at the intersections of a first set of control lines (e.g., word lines) arranged in a first direction and a second set of control lines (e.g., bit lines) arranged in a second direction perpendicular to the first direction. A three-dimensional cross-point memory array includes vertical bit lines or bit lines that are arranged orthogonal to a semiconductor substrate.

The memory cells used in a three-dimensional cross-point memory array may be state-change memory cells, such as resistance-switching memory cells, phase change memory cells, or other types of memory cells. For some state-change memory cells, the resistance (and thus inversely the conductance) of the individual memory cells is changed as a result of a voltage placed across the orthogonally intersecting conductors to which the memory cell is connected. Depending on the type of state-change memory cell, the state may change in response to a voltage across it, a level of current though it, an amount of electric field across it, a level of heat applied to it, and the like.

With some state-change memory cell material, the amount of time that the voltage, current, electric field, heat and the like is applied to the element determines when its conductive state changes and the direction in which the change takes place. In between such state changing operations, the resistance of the memory cell remains unchanged, so is non-volatile. The three-dimensional cross-point memory array architecture described herein may be implemented with a memory cell material selected from a wide variety of such materials having different properties and operating characteristics.

The resistance of the memory cell, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory cell stores one-bit of data. With the use of some materials, more than one bit of data may be stored in each memory cell by designating more than two stable levels of resistance as detectable states of the memory cell. The three-dimensional cross-point memory array architecture herein is quite versatile in the way it may be operated.

In addition, the three-dimensional architecture herein allows variable resistance memory cells to be connected at orthogonal crossings of bit and word line conductors without the need for diodes or other non-linear elements being connected in series with the variable resistive elements. In existing arrays of variable resistance memory cells, a diode is commonly connected in series with each memory cell to reduce the leakage current though the element when it is unselected but nevertheless has a voltage difference placed across it, such as can occur when the unselected memory cell is connected to a bit or word line carrying voltages to selected memory cells connected to those same lines.

Referring to FIG. 1, an architecture of an example embodiment of a three-dimensional (3D) memory array 100 is illustrated in the form of an equivalent circuit of a portion of such a memory. A standard three-dimensional rectangular coordinate system is used for reference, the directions of each of vectors x, y and z being orthogonal with the other two. In an embodiment, the word lines and bit lines of a memory array may cross at an angle equal to or about 90 degrees. In another embodiment, the word lines and bit lines of a memory array may cross at an angle equal to or about 60 degrees.

Memory cells $M_{zxy}$ are formed in a plurality of planes positioned at different distances in the z-direction above the substrate 102. Two planes 1 and 2 are illustrated in FIG. 1, but typically there will be more planes, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines.

Individual memory storage elements $Mz_{xy}$ are connected between one local bit line $LBL_{xy}$ and one word line $WL_{zy}$ adjacent these individual crossings. An individual memory cell $M_{zxy}$ is therefore addressable by placing proper voltages on the local bit line $LBL_{xy}$ and word line $WL_{zy}$ between which the memory cell is connected. The voltages are chosen to provide the electrical stimulus necessary to cause the state of the memory cell to change from an existing state to the desired new state. The levels, duration and other characteristics of these voltages depend upon the material that is used for the memory cells.

Each "plane" of the three-dimensional memory structure is typically formed of at least two layers, one in which the conductive word lines $WL_{zy}$ are positioned and another of a dielectric material that electrically isolates the planes from each other. Additional layers also may be present in each plane, depending for example on the structure of the memory cells $M_{zxy}$. The planes are stacked on top of each other above semiconductor substrate 102 with the local bit lines $LBL_{xy}$ being connected with storage elements $M_{zxy}$ of each plane through which the local bit lines extend.

A circuit for selectively connecting internal memory cells with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines (GBL) are elongated in the y-direction and have relative positions in the x-direction that are indicated by the subscript.

Global bit lines (GBL) are individually connectable with the source or drain of the select devices $Q_{xy}$ having the same position in the x-direction, although during reading and also typically programming only one select device connected with a specific global bit line is turned ON at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

To connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns ON the select devices to which it is connected. The remaining row select lines receive voltages that keep their connected select devices $Q_{xy}$ OFF. Because only one select device ($Q_{xy}$) is used with each of the local bit lines ($LBLx_y$), the pitch of the array across the semiconductor substrate in both x and y-directions may be made very small, and thus the density of the memory storage elements large.

The memory arrays described herein, including 3D memory array 100, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three dimensional memory arrays.

Figure 2:
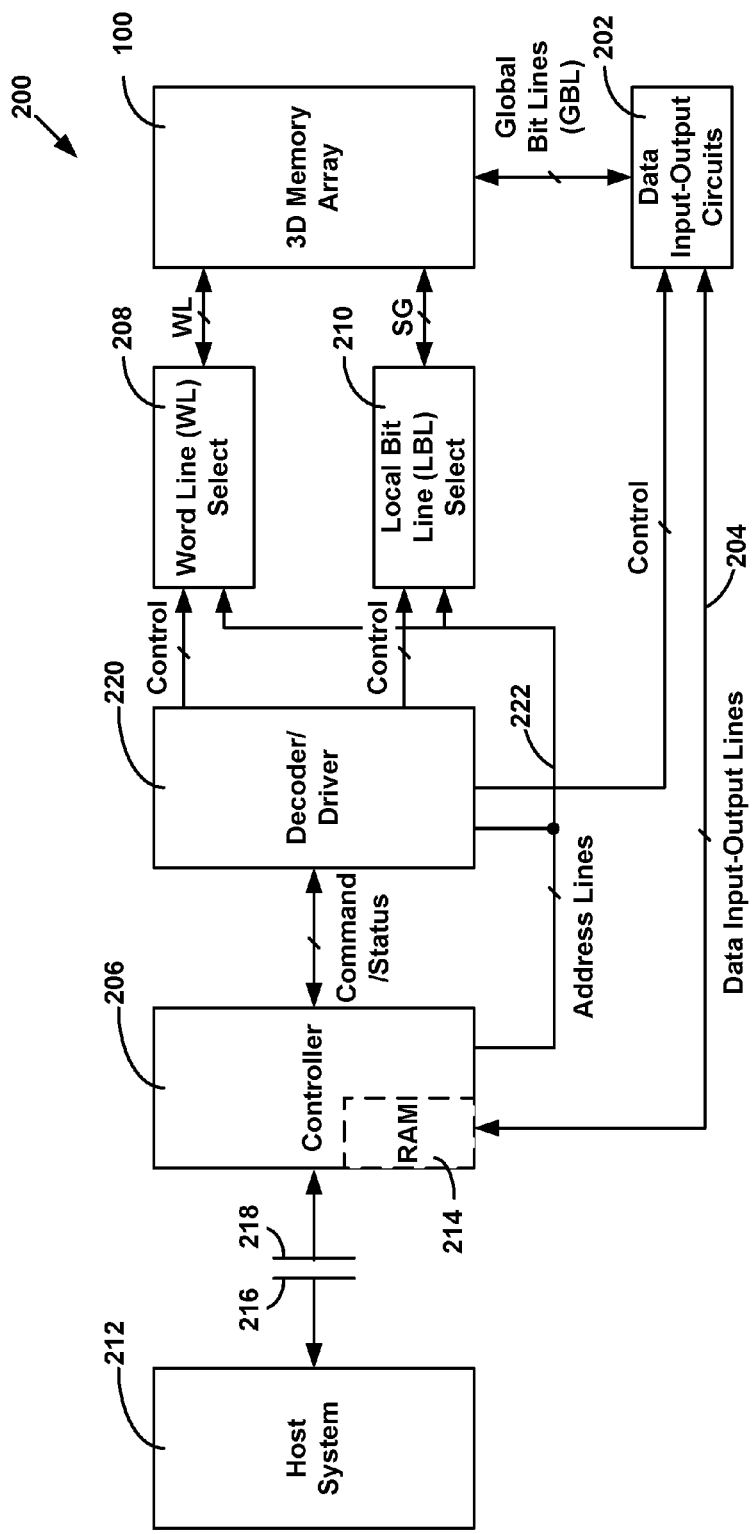
FIG. 2 is a schematic block diagram of a re-programmable non-volatile memory system which utilizes the memory array of FIG. 1, and which indicates connection of the memory system with a host system.

FIG. 2 is a block diagram of an illustrative memory system 200 that can use 3D memory array 100 of FIG. 1. Data input-output circuits 202 are connected to provide (during programming) and receive (during reading) analog electrical quantities in parallel over the global bit-lines $GBL_x$ of FIG. 1 that are representative of data stored in addressed memory cells $M_{zxy}$. Data input-output circuits 202 typically contain sense amplifiers for converting these electrical quantities into digital data values during reading, which digital values are then conveyed over lines 204 to a memory system controller 206. Conversely, data to be programmed into 3D memory array 100 are sent by controller 206 to data input-output circuits 202, which then program that data into addressed memory cells by placing proper voltages on the global bit lines $GBL_x$.

For binary operation, one voltage level is typically placed on a global bit line to represent a binary "1," and another voltage level to represent a binary "0." The memory cells are addressed for reading or programming by voltages placed on the word lines $WL_{zy}$ and row select lines $SG_y$ by respective word line select circuits 208 and local bit line select circuits 210. In the specific three-dimensional array of FIG. 1, the memory cells lying between a selected word line and any of the local bit lines $LBL_{xy}$ connected at one instance through the select devices $Q_{xy}$ to the global bit lines $GBL_x$ may be addressed for programming or reading by appropriate voltages being applied through word line select circuits 208 and local bit line select circuits 210.

Controller 206 typically receives data from and sends data to a host system 212. Controller 206 usually contains an amount of random-access-memory (RAM) 214 for temporarily storing such data and operating information. Commands, status signals and addresses of data being read or programmed are also exchanged between controller 206 and host system 212.

Memory system 200 operates with a wide variety of host systems 212, such as personal computers (PCs), laptop and other portable computers, cellular telephones, personal digital assistants (PDAs), digital still cameras, digital movie cameras and portable audio players. Host system 212 typically includes a built-in receptacle 216 for one or more types of memory cards or flash drives that accepts a mating memory system plug 218 of memory system 200 but some host systems 212 require the use of adapters into which a memory card is plugged, and others require the use of cables therebetween. Alternatively, memory system 200 may be built into host system 212 as an integral part thereof.

Controller 206 conveys to decoder/driver circuits 220 commands received from the host system 212. Similarly, status signals generated by memory system 200 are communicated to controller 206 from decoder/driver circuits 220. Decoder/driver circuits 220 can be simple logic circuits, in the case where controller 206 controls nearly all of the memory operations, or can include a state machine to control at least some of the repetitive memory operations necessary to carry out given commands. Control signals resulting from decoding commands are applied from decoder/driver circuits 220 to word line select circuits 208, local bit line select circuits 210 and data input-output circuits 202.

Also connected to word line select circuits 208 and local bit line select circuits 210 are address lines 222 from controller 206 that carry physical addresses of memory cells to be accessed within 3D memory array 100 to carry out a command from host system 212 The physical addresses correspond to logical addresses received from host system 212, the conversion being made by controller 206 and/or decoder/driver circuits 220.

As a result, local bit line select circuits 210 partially address the designated storage elements within 3D memory array 100 by placing proper voltages on the control elements of the select devices $Q_{xy}$ to connect selected local bit lines (LBLx$_y$) with the global bit lines (GBL$_x$). The addressing is completed by word line select circuits 208 applying proper voltages to the word lines WL$_{zy}$ of the array. In one embodiment, any one or combination of controller 206, decoder/driver circuits 220, data input-output circuits 202, word line select circuits 208 and local bit line select circuits 210, or other control logic can be referred to as one or more control circuits.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, controllers, and so forth. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Although memory system 200 utilizes 3D memory array 100 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share controller 206 with 3D memory array 100, particularly if there is some compatibility between the two types of memory at an operational level.

Although each of the memory cells $M_{zxy}$ in 3D memory array 100 of FIG. 1 may be individually addressed for changing its state according to incoming data or for reading its existing storage state, in some embodiments it may be preferable to program and read the array in units of multiple memory cells in parallel. In 3D memory array 100 of FIG. 1, one row of memory cells on one plane may be programmed and read in parallel. The number of memory cells operated in parallel depends on the number of memory cells connected to the selected word line.

In some 3D memory arrays 100, the word lines may be segmented (not shown in FIG. 1) so that only a portion of the total number of memory cells connected along their length may be addressed for parallel operation, namely the memory cells connected to a selected one of the segments. In some 3D memory arrays 100 the number of memory cells programmed in one operation may be less than the total number of memory cells connected to the selected word line to minimize IR drops, to minimize power, or for other reasons.

Previously programmed memory cells whose data have become obsolete may be addressed and re-programmed from the states in which they were previously programmed. The states of the memory cells being re-programmed in parallel will therefore most often have different starting states among them. This is acceptable for many memory cell materials but it is usually preferred to re-set a group of memory cells to a common state before they are re-programmed. For this purpose, the memory cells may be grouped into blocks, where the memory cells of each block are simultaneously reset to a common state, preferably one of the programmed states, in preparation for subsequently programming them.

If the memory cell material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem because resetting blocks of memory cells containing nothing but obsolete data is typically accomplished in a high percentage of the cases in the background, therefore not adversely impacting the programming performance of the memory system.

With the use of block re-setting of memory cells, a three-dimensional array of variable resistive memory cells may be operated in a manner similar to current flash memory arrays. Resetting a block of memory cells to a common state corresponds to erasing a block of flash memory cells to an erased state. The individual blocks of memory cells herein may be further divided into a plurality of pages of storage elements, wherein the memory cells of a page are programmed and read together.

This is like the use of pages in flash memories. The memory cells of an individual page are programmed and read together. Of course, when programming, those memory cells that are to store data that are represented by the reset state are not changed from the reset state. Those of the memory cells of a page that need to be changed to another state in order to represent the data being stored in them have their states changed by the programming operation.

Figure 3:
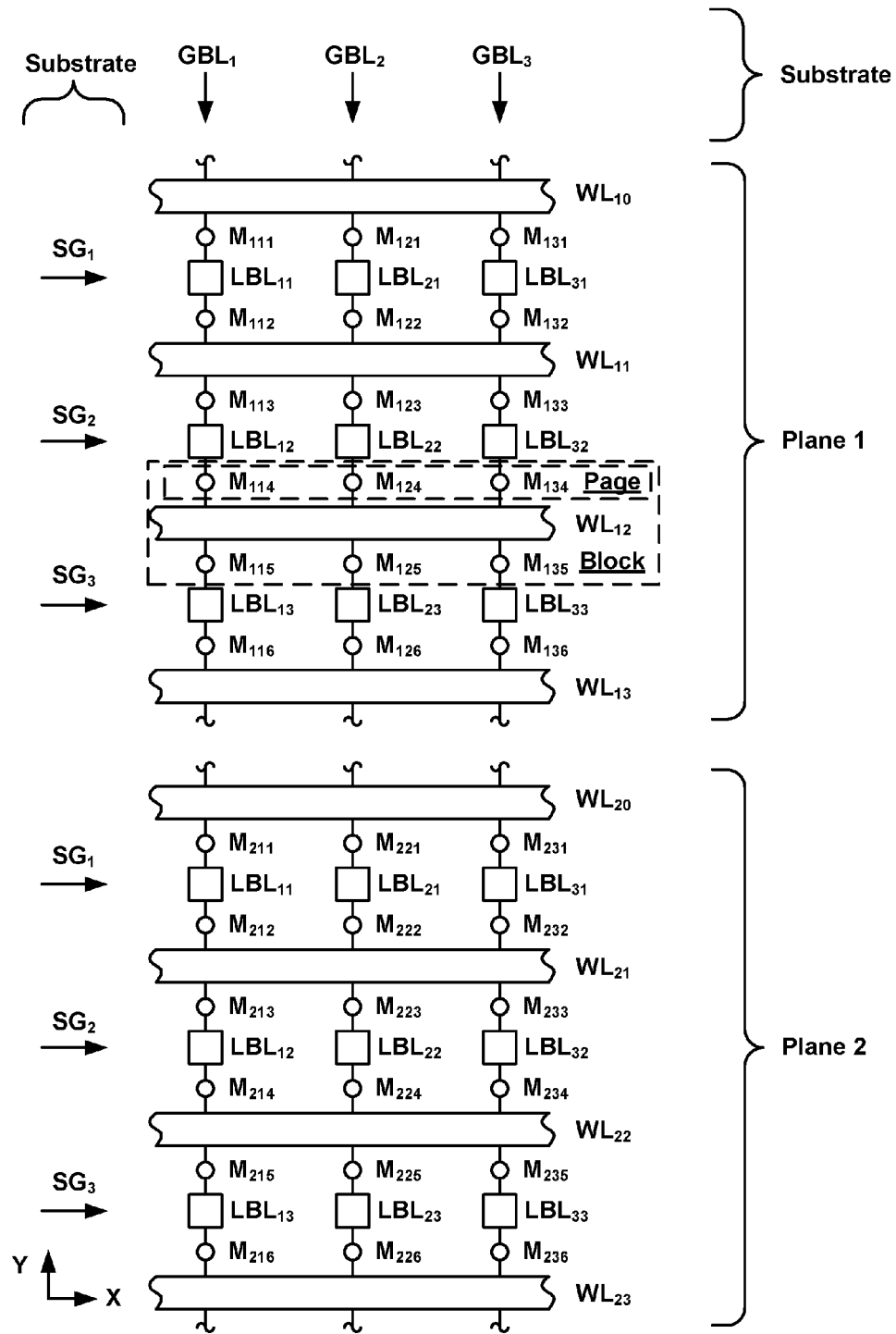
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of 3D memory array 100 of FIG. 1. The different word lines WL$_{zy}$ that extend across each of the planes and the local bit lines LBL$_{xy}$ that extend through the planes are shown in two-dimensions. Individual blocks are made up of memory cells connected to both sides of one word line, or one segment of a word line if the word lines are segmented, in a single one of the planes. There are therefore a very large number of such blocks in each plane of the array.

In the block illustrated in FIG. 3, each of the memory cells $M_{114}$, $M_{124}$, $M_{134}$, $M_{115}$, $M_{125}$ and $M_{135}$ connected to both sides of one word line WL$_{12}$ form the block. Of course, there will be many more memory cells connected along the length of a word line but only a few of them are illustrated, for simplicity. The memory cells of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory cells along one side of the word line of the block and the other page by the memory cells along the opposite side of the word line. The example page marked in FIG. 3 is formed by memory cells $M_{114}$, $M_{124}$ and $M_{134}$. Of course, a page will typically have a very large number of memory cells in order to be able to program and read a large amount of data at one time. Only a few of the storage elements of the page of FIG. 3 are included, for simplicity in explanation.

Example resetting, programming and reading operations of the memory array of FIGS. 1 and 3, when operated as 3D memory array 100 in the memory system of FIG. 2, will now be described. For these examples, each of the memory cells $M_{zxy}$ is taken to include a non-volatile memory material that can be switched between two stable states of different resistance levels by impressing voltages (or currents) of different polarity across the memory cell, or voltages of the same polarity but different magnitudes and/or duration.

For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory cells that indicate storage of one bit of data, which is either a "0" or a "1," depending upon the memory cell state.

To reset (e.g., erase) a block of memory cells, the memory cells in that block are placed into their high resistance state. This state will be designated as the logical data state "1," following the convention used in current flash memory arrays, but alternatively it could be designated to be a "0." As shown by the example in FIG. 3, a block includes all the memory cells that are electrically connected to one word line WL or segment thereof. A block is the smallest unit of memory cells in the array that are reset together. It can include thousands of memory cells. If a row of memory cells on one side of a word line includes 1000 of them, for example, a block will have 2000 memory cells from the two rows on either side of the word line.

The following steps may be taken to reset all the memory cells of a block, using the block illustrated in FIG. 3 as an example:

1. Set all of the global bit lines ($GBL_1$, $GBL_2$ and $GBL_3$ in the array of FIGS. 1 and 3) to zero volts, by data input-output circuits 202 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn ON the select devices $Q_{xy}$, for example, something in a range of 1-6 volts, typically 3 volts. The block shown in FIG. 3 includes the word line $WL_{12}$, so the row select lines $5G_2$ and $5_{G3}$ (FIG. 1) on either side of that word line are set to H' volts, by local bit line select circuits 210 of FIG. 2, to turn ON select devices $Q_{12}$, $Q_{22}$, $Q_{32}$, $Q_{13}$, $Q_{23}$ and $Q_{33}$. This causes each of local bit lines $LBL_{32}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the resistance-switching material in the memory cell and can be between a fraction of a volt to a few volts. All other word lines of the array, including the other word lines of selected plane 1 and all the word lines on the other unselected planes, are set to zero volts. In the array of FIGS. 1 and 3, word line $WL_{32}$ is placed at H volts, and all other word lines in the array are placed at zero volts, all by word line select circuits 208 of FIG. 2.

The result is that H volts are placed across each of the memory cells of the block. In the example block of FIG. 3, this includes the memory cells $M_{114}$, $M_{124}$, $M_{134}$, $M_{115}$, $M_{125}$ and $M_{135}$. For the type of memory material being used as an example, the resulting currents through these memory cells places any of them not already in a high resistance state, into that re-set state.

No stray currents will flow because only one word line has a non-zero voltage. The voltage on the one word line of the block can cause current to flow to ground only through the memory cells of the block. There is also nothing that can drive any of the unselected and electrically floating local bit lines to H volts, so no voltage difference will exist across any other memory cells of the array outside of the block. Therefore no voltages are applied across unselected memory cells in other blocks that can cause them to be inadvertently disturbed or reset.

The memory cells of a page are preferably programmed concurrently, to increase the parallelism of the memory system operation. An expanded version of the page indicated in FIG. 3 is provided in FIG. 4, with annotations added to illustrate a programming operation. The individual memory cells of the page are initially in their reset state because all the memory cells of its block have previously been reset. The reset state is taken herein to represent a logical data "1." For any of these memory cells to store a logical data "0" in accordance with incoming data being programmed into the page, those memory cells are switched into their low resistance state, their set state, while the remaining memory cells of the page remain in the reset state.

For programming a page, only one row of select devices is turned ON, resulting in only one row of local bit lines being connected to the global bit lines. This connection alternatively allows the memory cells of both pages of the block to be programmed in two sequential programming cycles, which then makes the number of memory cells in the reset and programming units equal.

Figure 4:
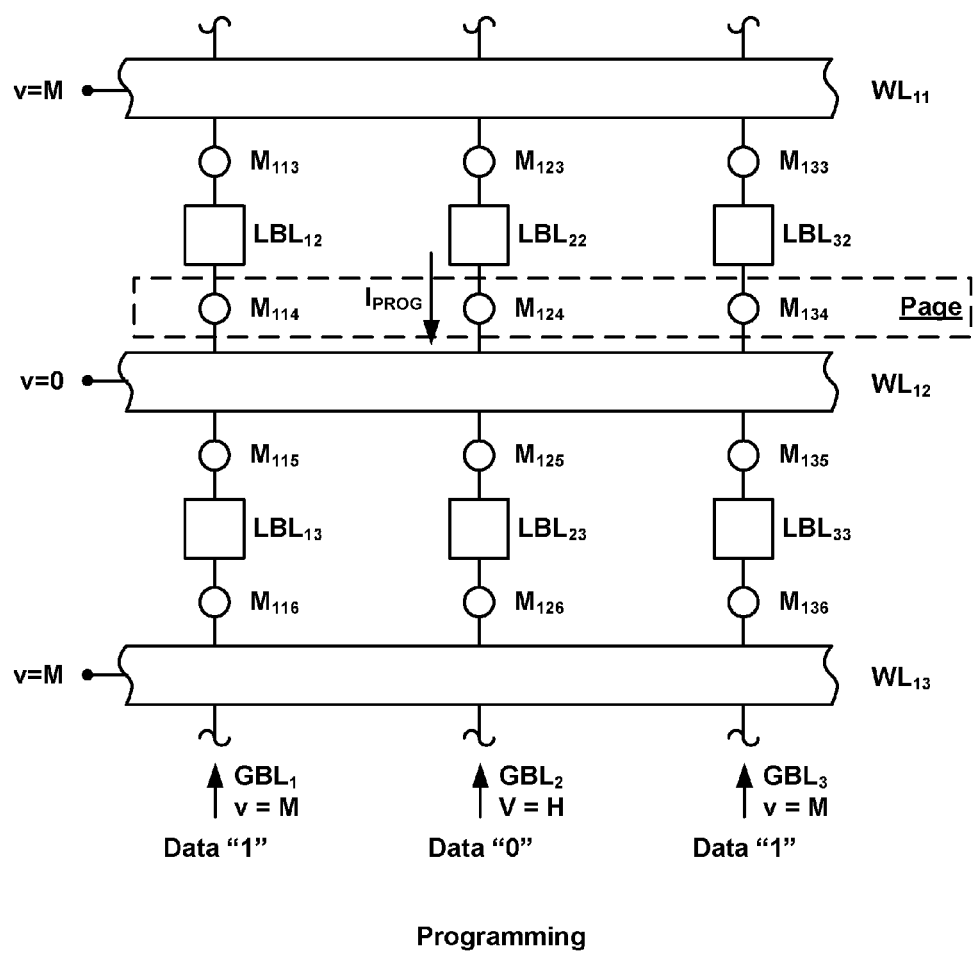
FIG. 4 is an expanded view of a portion of one of the planes of FIG. 3, annotated to show effects of programming data therein.

Referring to FIGS. 3 and 4, an example programming operation within the indicated one page of memory cells $M_{114}$, $M_{124}$ and $M_{134}$ is described, as follows:

1. The voltages placed on the global bit lines are in accordance with the pattern of data received by the memory system for programming. In the example of FIG. 4, $GBL_1$ carries logical data bit "1," $GBL_2$ the logical bit "0," and $GBL_3$ the logical bit "1." The bit lines are set respectively to corresponding voltages M, H and M, as shown, where the M level voltage is high but not sufficient to program a memory cell and the H level is high enough to force a memory cell into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory cells $M_{114}$ and $M_{134}$ are to remain in their reset state, while memory cell $M_{124}$ is being programmed. Therefore, the programming voltages are applied only to memory cell $M_{124}$ of this page by the following steps.

2. Set the word line of the page being programmed to 0 volts, in this case selected word line $WL_{12}$. This is the only word line to which the memory cells of the page are connected. Each of the other word lines on all planes is set to the M level. These word line voltages are applied by word line select circuits 208 of FIG. 2.

3. Set one of the row select lines below and on either side of the selected word line to the H' voltage level, to select a page for programming. For the page indicated in FIGS. 3 and 4, the H' voltage is placed on row select line $SG_2$ to turn on select devices $Q_{12}$, $Q_{22}$ and $Q_{32}$ (FIG. 1). All other row select lines, namely lines $SG_1$ and $SG_3$ in this example, are set to 0 volts to keep their select devices off. The row select line voltages are applied by bit line select circuits 210 of FIG. 2. This connects one row of local bit lines to the global bit lines and leaves all other local bit lines floating. In this example, the row of local bit lines $LBL_{32}$, $LBL_{22}$ and $LBL_{32}$ are connected to the respective global bit lines $GBL_1$, $GBL_2$ and $GBL_3$ through the select devices that are turned ON, while all other local bit lines (LBLs) of the array are left floating.

The result of this operation, for the example memory cell material mentioned above, is that a programming current $I_{PROG}$ is sent through the memory cell $M_{124}$, thereby causing that memory cell to change from a reset state to a set (programmed) state. The same will occur with other memory cells (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{32}$ and all word lines in the unselected other planes can be weakly driven to M, some lower voltage or allowed to float in order to reduce power that must be delivered by word line drivers that are part of word line select circuits 208 of FIG. 2.

By floating all the local bit lines other than the selected row (in this example, all but $LBL_{12}$, $LBL_{22}$ and $LBL_{32}$), voltages can be loosely coupled to outer word lines of the selected plane 1 and word lines of other planes that are allowed to float through memory cells in their low resistance state (programmed) that are connected between the floating local bit lines and adjacent word lines. These outer word lines of the selected plane and word lines in unselected planes, although allowed to float, may eventually be driven up to voltage level M through a combination of programmed memory cells.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating. This can reduce the power dissipation caused by charging a large number of word lines.

Although the above description assumes that each memory cell of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation.

Interspersed between each program operation is a verify (read) operation that determines whether an individual memory cell has reached its desired programmed level of resistance or conductance consistent with the data being programmed in the memory cell. The sequence of program/verify is terminated for each memory cell as it is verified to reach the desired value of resistance or conductance. After all of memory cells being programmed are verified to have reached their desired programmed value, programming of the page of memory cells is then completed.

Figure 5:
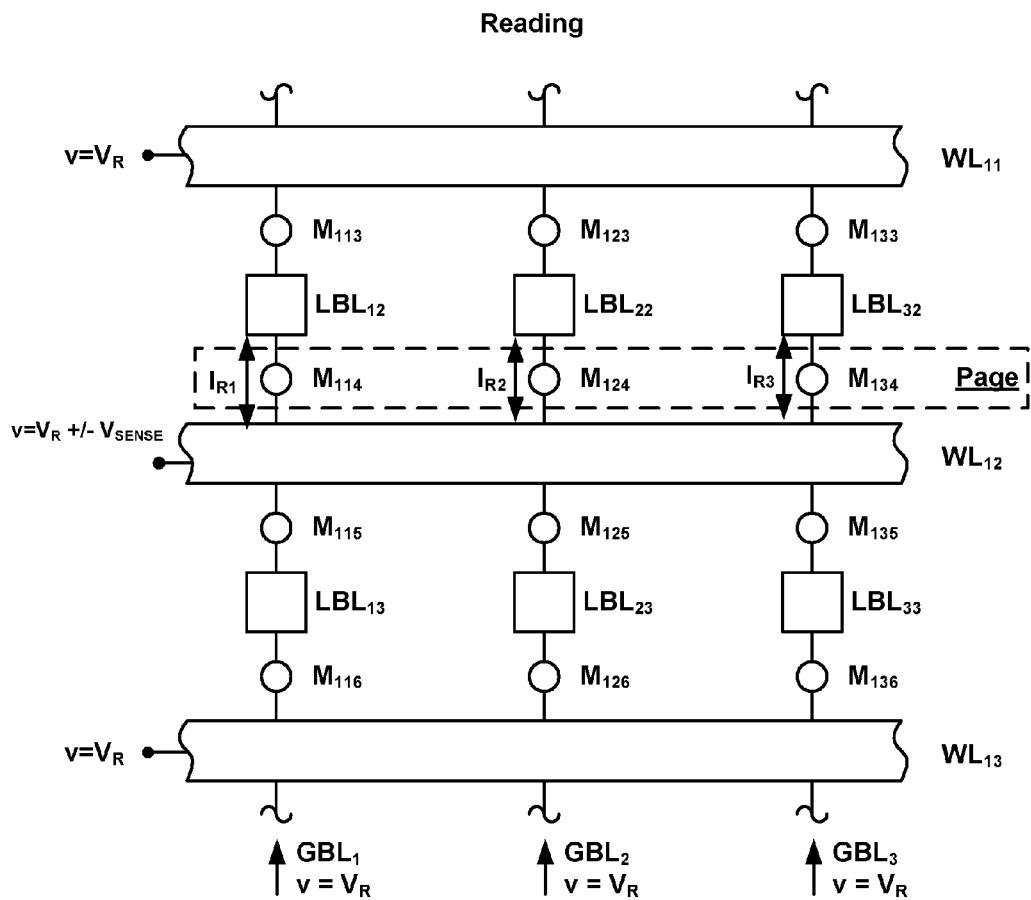
FIG. 5 is an expanded view of a portion of one of the planes of FIG. 3, annotated to show effects of reading data therefrom.

With reference primarily to FIG. 5, the parallel reading of the states of a page of memory cells, such as the memory cells $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn ON one row of select devices by placing a voltage on the control line adjacent to the selected word line to define the page to be read. In the example of FIGS. 1 and 5, a voltage is applied to the row select line $SG_2$ to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in data input-output circuits 202 of FIG. 2, and assume the potential $V_R$ of the global bit lines to which they are connected. All other local bit lines LBLs are allowed to float.

3. Set the selected word line ($WL_{12}$) to a voltage of $V_R \pm V\text{sense}$. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory cells of the example of FIG. 5, which are proportional to the programmed states of the respective memory cells $M_{114}$, $M_{124}$ and $M_{134}$. The states of the memory cells $M_{114}$, $M_{124}$ and $M_{134}$ are then given by binary outputs of the sense amplifiers within data input-output circuits 202 that are connected to the respective global bit lines $GBL_1$, $GBL_2$ and $GBL_3$. These sense amplifier outputs are then sent over lines 204 (FIG. 2) to controller 206, which then provides the read data to host system 212.

5. Turn OFF the select devices ($Q_{12}$, $Q_{22}$ and $Q_{32}$) by removing the voltage from the row select line ($SG_2$) to disconnect the local bit lines from the global bit lines, and return the selected word line ($WL_{12}$) to the voltage $V_R$.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory cell that is in its programmed (low resistance) state and connected between a floating local bit line and a word line at $V_R$, in any plane.

Although the neighboring word lines should be at $V_R$, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V_{sense}$ but the sense amplifier current is not measured until this charging transient is completed.

The material used for the non-volatile memory cells $M_{zxy}$ in the array of FIG. 1 can be a chalcogenide, a metal oxide (MeOx), solid electrolytes, phase-change materials, carbon films, carbon nanotubes, or any one of a number of materials that exhibit a stable, reversible shift in resistance in response to an external voltage applied to or current passed through the material. Examples metal oxides include TiOx, HfOx, ZrOx, WOx, NiOx, CoOx, CoalOx, MnOx, $ZnMn_2O_4$, ZnOx, TaOx, NbOx, HfSiOx, HfAlOx. Examples of solid electrolytes include TaO, GeSe or GeS. Example phase-change materials include chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements.

For simplicity the above description has considered the simplest case of storing one data value within each cell: each cell is either reset or set and holds one bit of data. However, the techniques of this technology are not limited to this simple case. By using various values of ON resistance and designing the sense amplifiers to be able to discriminate between several of such values, each memory cell can hold multiple-bits of data in a multiple-level cell (MLC).

Figure 6:
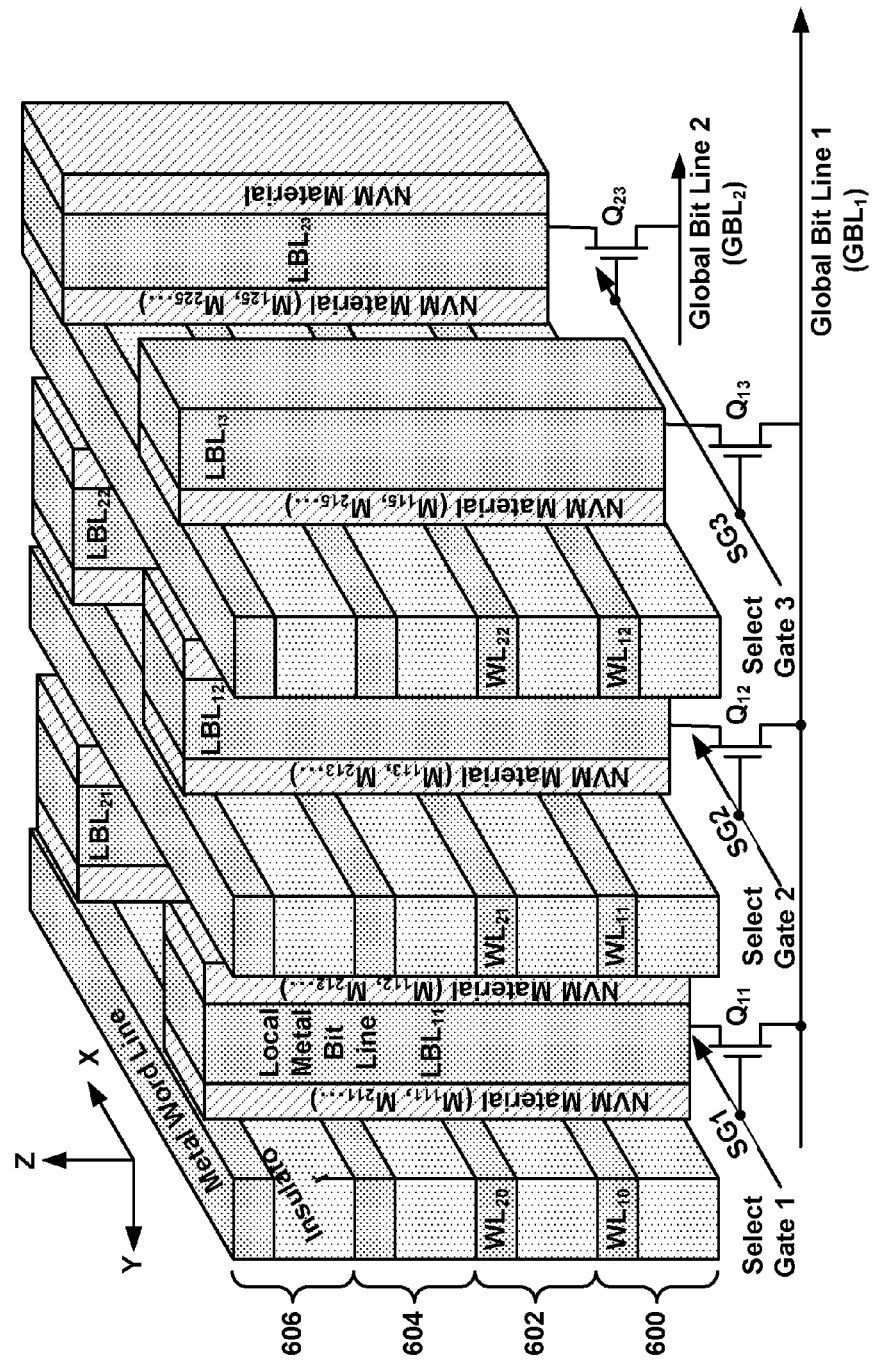
FIG. 6 is an isometric view of a portion of the three-dimensional array shown in FIG. 1 according to a first specific example of an implementation thereof.

One example semiconductor structure for implementing 3D memory array 100 of FIG. 1 is illustrated in FIG. 6, which is configured for use of non-volatile memory (NVM) material that is non-conductive when first deposited. A metal oxide of the type discussed above has this characteristic. Because the material is initially non-conductive, there is no necessity to isolate the memory cells at the cross-points of the word and bit lines from each other.

Several memory cells may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 600, 602, 604 and 606 of the three-dimensional array are shown. Elements of the FIG. 6 array that correspond to those of the equivalent circuit of FIG. 1 are identified by the same reference numbers. FIG. 6 shows the two planes 1 and 2 of FIG. 1, plus two additional planes on top of them. All of the planes have the same horizontal pattern of conductor, dielectric and NVM material.

In each plane, metal word lines (WL) are elongated in the x-direction and spaced apart in the y-direction. Each plane includes a layer of insulating dielectric that isolates its word lines from the word lines of the plane below it or, in the case of plane 600, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry.

In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes hafnium oxide, the word lines comprise TiN, and the bit lines comprise N+silicon.

There also may be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

In some memory arrays, a separate word line driver is used to set the voltage level of each word line in the memory array. In other memory arrays, to minimize the number of required word line drivers, each word line driver may be connected to a group of multiple word lines connected together, where a memory system will have many of such groups.

In one example implementation, 16 (or another number) of word lines are connected together, and the connected group of word lines are connected to a single word line driver. In one example, the 16 word lines are connected together to form a comb shape. However, other shapes can also be used. Using one word line driver to drive 16 (or a different number) of word lines in a single comb (or other shaped structure) reduces the number of word line drivers. As a result, the word line drivers can fit underneath the memory array.

The use of the vertically oriented select devices described above also provides more room underneath the memory array (e.g., in the substrate) to implement word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines settle quicker and there is no significant transient effect that causes a disturb for unselected memory cells.

Figure 7:
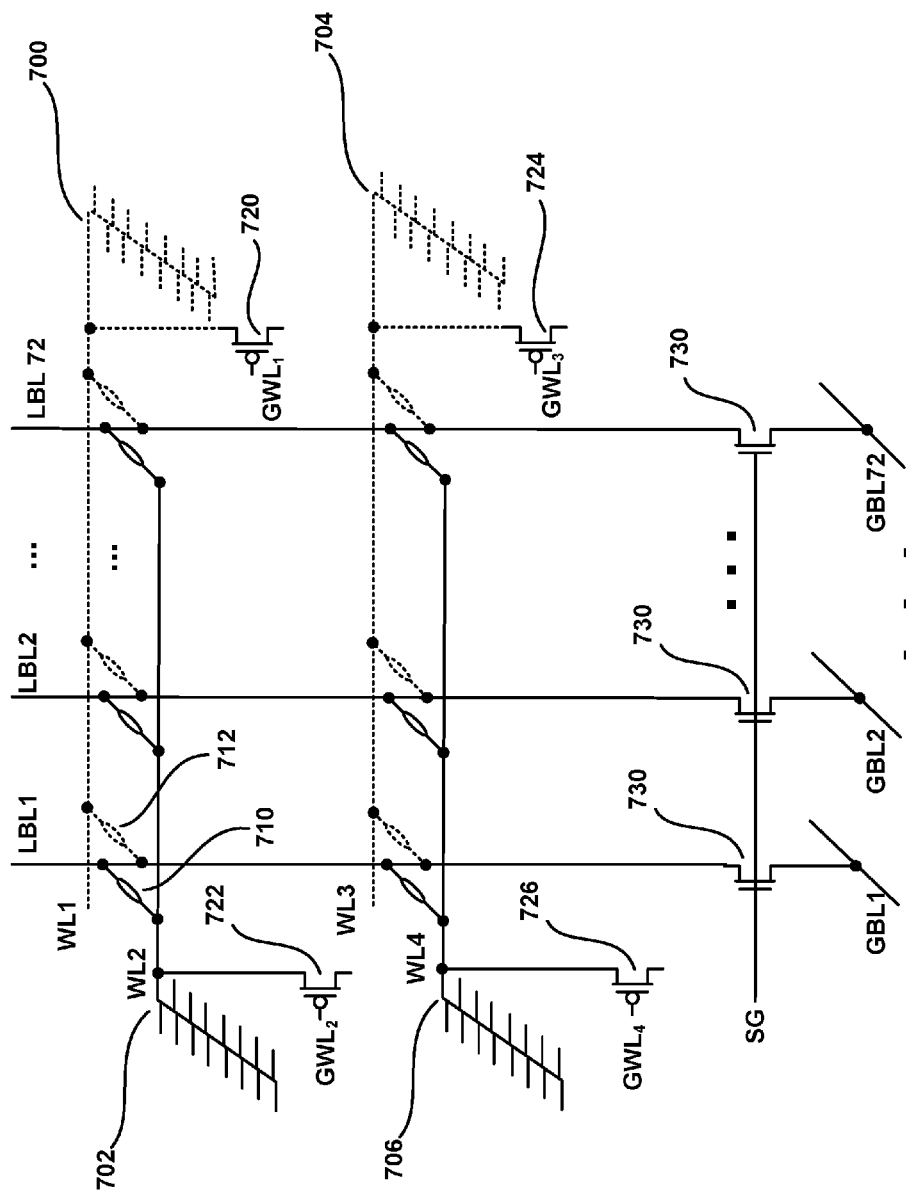
FIG. 7 is a schematic of a portion of the memory system, depicting vertical bit lines, select devices and word line combs (connected word lines).

FIG. 7 is a partial schematic depicting a portion of a memory system which uses the comb structure described above. For example, FIG. 7 shows combs 700, 702, 704 and 706. A memory system is likely to have many more combs than depicted in FIG. 7. FIG. 7 show fours combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block.

FIG. 7 shows that combs 700 and 702 (and all of the attached word line fingers) are in a first plane or level of the memory array, and combs 704 and 706 (and all of the attached word line fingers) are on a second plane or level of the memory array. Each of the combs has a signal line to one word line driver. For example, word line comb 700 is connected to word line driver 720. When word line comb 700 is selected, all of the word line fingers connected to word line comb 700 are selected (e.g., receive the selected word line signal).

Word line comb 702 is connected to word line driver 722. Word line comb 704 is connected to word line driver 724. Word line comb 706 is connected to word line driver 726. Word line drivers 720, 722, 724 and 726 are implemented underneath the memory array in the substrate. In one embodiment, a word line driver is located underneath the block (or one of the blocks) to which it is connected.

FIG. 7 shows that word line comb 700 includes word line WL1 which is connected to memory cells that are connected to local bit lines LB1, LB2, . . . LB72 (72 local bit lines). Word line combs 702, 704 and 706 include word lines WL2, WL3 and WL4, respectively, that each are connected to memory cells that are also connected to the same 72 local bit lines LBL1, LBL2, . . . LBL72. In this arrangement, word line combs 700 and 704 are on one side of the memory array and word line combs 702 and 706 are on the opposite side of the memory array such that the word line fingers from comb 700 are interleaved with the word line fingers of word line comb 702, and word line fingers from comb 704 are interleaved with the word line fingers of word line comb 706. To make it easier to read, word line combs 700, 704, and their word line fingers appear as dotted lines to show that they are from the right side of the memory array, whereas word line combs 702, 706 are solid lines to show that they are from the left side of the memory array.

In this arrangement, each memory cell connected to a word line of word line comb 702 for the block being depicted will have a corresponding memory cell connected to a word line for word line comb 700 that connects to the same local bit line. For example, memory cell 710 (connected to WL2) and memory cell 712 (connected to WL1) are both connected to LBL1. Therefore, the system has to be operated such that if LBL1 is selected, only appropriate memory cell 710 or 712 should be selected. Note that the local bit lines are connected to the appropriate global bit lines by select devices 730.

Figure 8:
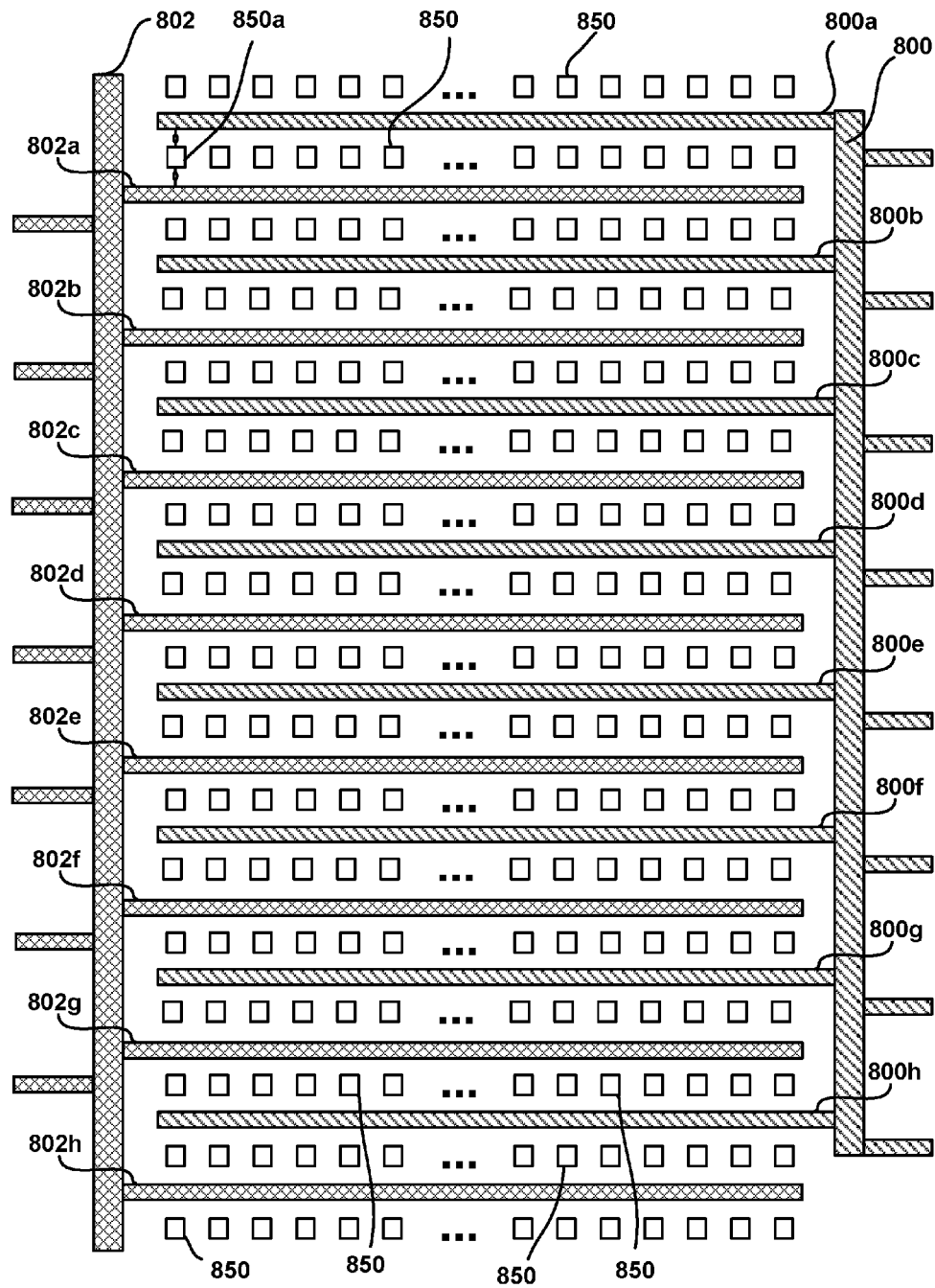
FIG. 8 is a top view of two word line combs and multiple vertical bit lines.

FIG. 8 is atop view of one layer of the memory array depicting part of two word line combs 800 and 802. As described above, each word line comb has word line fingers on two sides of its spine. FIG. 8 only shows the word line fingers on one side of each spine (with stubs being depicted for the word line fingers on the other side of the spine). For example, word line comb 800 includes word line fingers 800a, 800b, 800c, 800d, 800e, 800f, 800g and 800h, and word line comb 802 includes word line fingers 802a, 802b, 802c, 802d, 802e, 802f, 802g and 802h.

Between adjacent word line fingers from word line combs 802 and 800 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory cell. To make the drawing easy to read, memory cells are only depicted for local bit line 850a.

Because two word line comb structures are interleaved and share local bit lines, biasing memory cells connected to one of the word line combs (and not the other) will have an effect on the other word line comb. Biasing the vertical bit lines will have an effect on all memory cells (for any word line comb) connected to those bit lines, even though the respective word line combs are not biased. Biasing a word line comb will bias all 16 (or other number) of word line fingers that are part of that word line comb.

Figure 9:
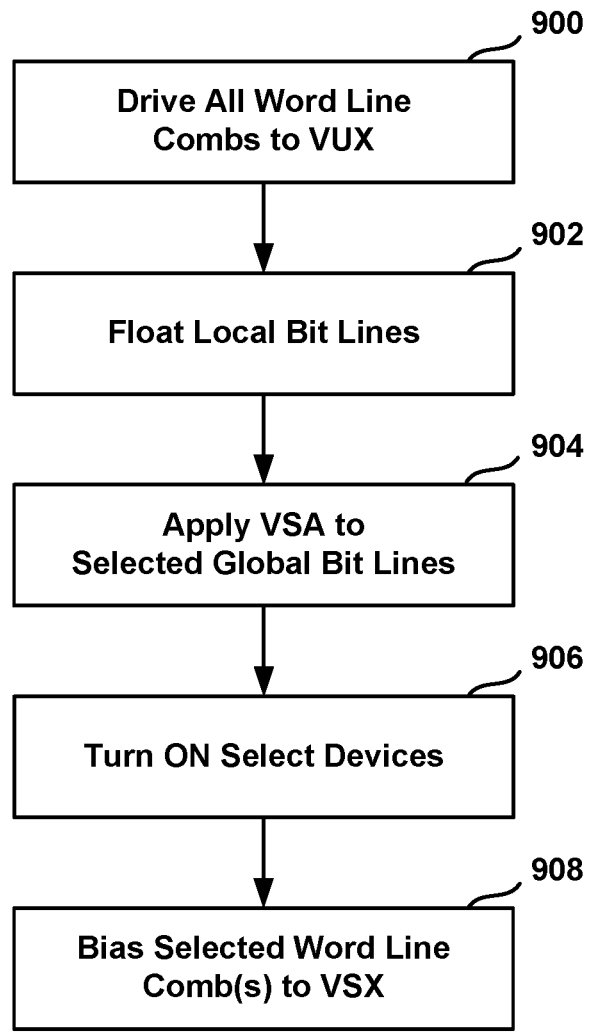
FIG. 9 is a flowchart describing an embodiment of a process programming memory cells.

FIG. 9 is a flow chart describing an embodiment of a process for programming memory cells. The process of FIG. 9 can be performed as part of a SET process or as part of a RESET process. In Step 900, all word line combs are driven to an unselected word line voltage VUX. In some embodiments, VUX may be between about 1V and about 5V, although other VUX values may be used.

In step 902, the local bit lines are all floated, and therefore they will drift to or near VUX. Alternatively, the local bit lines may be set to a voltage M, where the M level voltage is high but not sufficient to program a memory cell (such as described in connection with FIG. 4). In step 904, a selected bit line voltage VSA is applied to selected global bit lines. In some embodiments, VSA may be between about 4V and about 8V, although other VSA values may be used.

In step 906, the select devices are turned ON to connect the local bit lines to the global bit lines. Accordingly, the selected local bit lines will rise to or toward VSA. In step 908, the selected word line comb is biased at a selected word line voltage VSX. In some embodiments, VSX may be between about 0V and about 4V, although other VSX values may be used. In some embodiments more than one word line comb can be pulled to VSX. In other embodiments, only one word line comb can be selected at a time.

Figure 10:
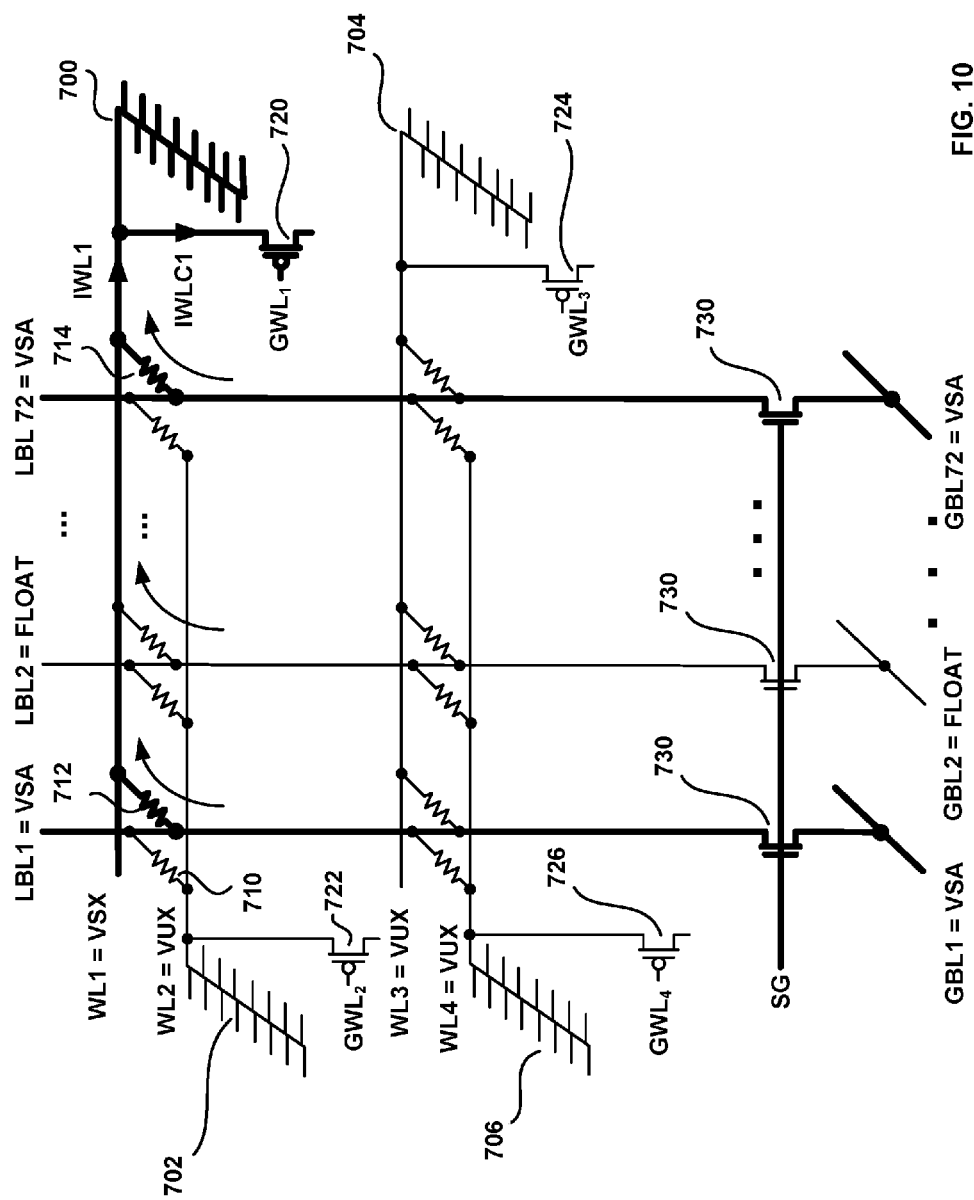
FIG. 10 is a schematic of a portion of the memory system, depicting vertical bit lines, select devices and word line combs.

FIG. 10 illustrates the portion of the memory system of FIG. 7 during a programming operation of memory cell 712, which is coupled between word line WL1 and local bit line LB1, and memory cell 714, which is coupled between word line WL1 and local bit line LB72. In accordance with the method of FIG. 9, word line combs 700, 702, 704 and 706 are driven to unselected word line voltage VUX (e.g., 3V). Next, local bit lines LB1, LB2, . . . LB72 are all floated, and therefore they will drift to or near VUX. Alternatively, as described above in connection with step 902 of FIG. 9, local bit lines LB1, LB2, . . . LB72 can be set to a voltage M, where the M level voltage is high but not sufficient to program a memory cell (such as described in connection with FIG. 4). The selected bit line voltage VSA (e.g., 6V) is applied to the selected global bit lines GBL1 and GBL72, and select device SG is turned ON to connect the local bit lines LB1, LB2, . . . LB72 to global bit lines GBL1, GBL2, . . . GBL72. Accordingly, selected local bit lines LB1 and LB72 each rise to or toward VSA. Finally, selected word line comb 700 is biased at the selected word line voltage VSX (e.g., 2V).

Current conducted by local bit lines LBL1, LBL2, . . . LBL72 sum to form a word line current IWL1, and the currents conducted by each of the word lines on word line comb 700 sum to form a word line comb current IWLC1, which is conducted by word line driver 720 and related circuitry.

Because the resistance of memory cells in the memory array vary based on the data values stored in the memory cells, the currents conducted by the memory cells, and hence IWL1 and IWLC1 vary based on the data values stored in the memory cells coupled to the selected word line comb and the selected word line, respectively. Further, conductors on the individual word lines, word line combs, and word line driver circuitry each have a non-zero resistance, and thus voltage drops along each of these conductors and driver circuitry may cause the actual voltage at a particular selected word line to differ from the desired selected word line voltage supplied by the driver circuitry. Technology is described to compensate for such word line voltage drops.

Figure 11A:
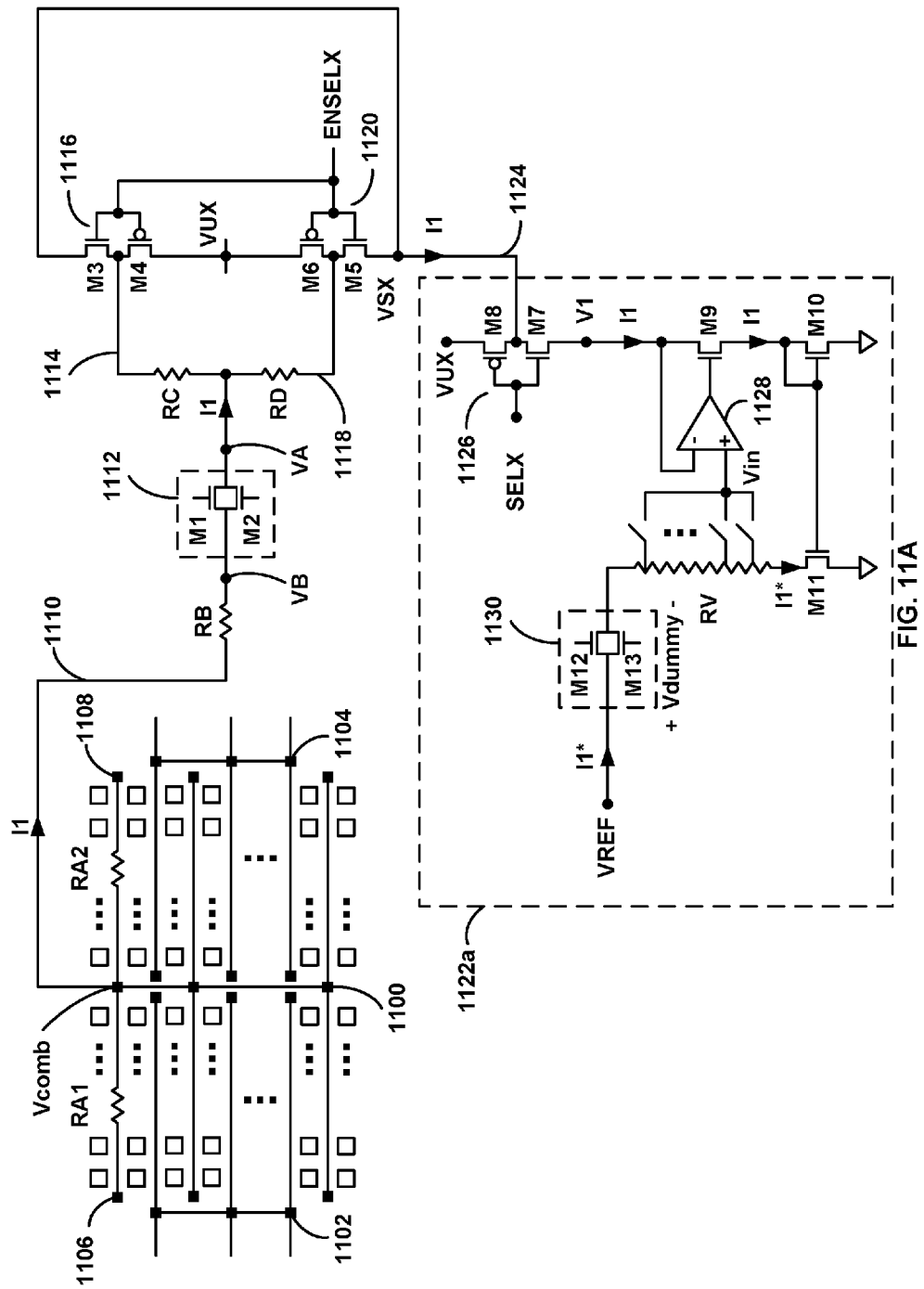
FIGS. 11A-11C are diagrams of embodiments of a portion of a memory array coupled to example driver circuitry and selector circuitry.

FIG. 11A is a diagram of an embodiment of a portion of a memory array, such as 3D memory array 100 of FIG. 1, coupled to driver circuitry and selector circuitry for selectively coupling word line combs to a selected word line voltage VSX and an unselected word line voltage VUX. As described in more detail below, FIG. 11A also includes a compensation circuit that provides current-sensing word line compensation.

In particular, FIG. 11A shows a top view of one layer of the memory array depicting part of three word line combs 1100, 1102 and 1104. Each of word line combs 1100, 1102 and 1104 includes multiple word line fingers, each of which has a non-zero resistance. For example, word line comb 1100 includes a word line finger 1106 having a word line resistance RA1 and a word line finger 1108 having a word line resistance RA2. To avoid complicating the drawing, the word line resistance of other word lines on word line combs 1100, 1102 and 1104 are not depicted.

In an embodiment, word line comb 1100 is coupled via a conductor 1110 (having a resistance RB) to a word line driver 1112 that includes parallel-coupled transistors M1 and M2, such a n-channel MOSFET transistors. Word line driver 1112 has an input terminal VA and an output terminal VB. Drain terminals of n-channel transistors M1 and M2 are coupled together at input terminal VA, which is coupled via a conductor 1114 (having a resistance RC) to a selector 1116, and via a conductor 1118 (having a resistance RD) to a selector 1120. Source terminals of n-channel transistors M1 and M2 are coupled together at output terminal VB.

In an embodiment, selector 1116 includes an n-channel transistor M3 and a p-channel transistor M4. N-channel transistor M3 has a drain terminal coupled to a selected word line voltage node VSX, a gate terminal coupled to a control signal ENSELX, and a source terminal coupled to conductor 1114. P-channel transistor M4 has a drain terminal coupled to an unselected word line voltage node VUX, a gate terminal coupled to control signal ENSELX, and a source terminal coupled to conductor 1114.

In an embodiment, selector 1120 includes an n-channel transistor M5 and a p-channel transistor M6. N-channel transistor M5 has a drain terminal coupled to selected word line voltage node VSX, a gate terminal coupled to control signal ENSELX, and a source terminal coupled to conductor 1118. P-channel transistor M6 has a drain terminal coupled to unselected word line voltage node VUX, a gate terminal coupled to control signal ENSELX, and a source terminal coupled to conductor 1118.

In an embodiment, control signal ENSELX has a first value (e.g., LOW) and a second value (e.g., HIGH). When control signal ENSELX is LOW, n-channel transistors M3 and M5 are OFF, p-channel transistors M4 and M6 are ON, and conductors 1114 and 1118 are coupled to unselected word line voltage node VUX. When control signal ENSELX is HIGH, n-channel transistors M3 and M5 are ON, p-channel transistors M4 and M6 are OFF, and conductors 1114 and 1118 are coupled to selected word line voltage node VSX.

Thus, word line driver 1112, selectors 1116 and 1120 and control signal ENSELX may be used to selectively couple word line comb 1100 to selected word line voltage node VSX (ENSELX=HIGH) and unselected word line voltage node VUX (ENSELX=LOW). Persons of ordinary skill in the art will understand that in other embodiments, more or fewer than two selectors 1116 and 1120 may be used. When control signal ENSELX is HIGH, word line comb 1100 is a selected word line, and is referred to in this description as "selected word line comb 1100."

In an embodiment, a compensation circuit 1122a provides current-sensing word line compensation. In particular, compensation circuit 1122a receives a current conducted by selected word line comb 1100, estimates a resistance of the conductive path between selected word line comb 1100 and the selected word line voltage node VSX, and generates a voltage at the selected word line voltage node VSX based on the received current and the estimated resistance so that a voltage of selected word line comb 1100 substantially equals a reference voltage VREF.

Compensation circuit 1122a includes a conductor 1124 coupled between selected word line voltage node VSX and a selector 1126. In an embodiment, selector 1126 includes an n-channel transistor M7 and a p-channel transistor M8. N-channel transistor M7 has a drain terminal coupled to a node V1, a gate terminal coupled to a control signal SELX, and a source terminal coupled to conductor 1124. P-channel transistor M8 has a drain terminal coupled to unselected word line voltage node VUX, a gate terminal coupled to control signal SELX, and a source terminal coupled to conductor 1124.

Compensation circuit 1122a also includes an opamp 1128, n-channel transistors M9, M10 and M11, and a variable resistor having a value RV. Compensation circuit 1122a optionally may also include a dummy word line driver 1130. Opamp 1128 has an inverting input node coupled to node V1 and a drain terminal of transistor M9, a non-inverting input node coupled to variable resistor RV, and an output node coupled to a gate terminal of transistor M9. Opamp 1128 and n-channel transistor M9 are configured as a unity gain buffer, with the voltage at node V1 equal to the voltage Vin at the non-inverting input node or opamp 1128.

N-channel transistor M9 has a source terminal coupled to a drain terminal of n-channel transistor m10. N-channel transistor M10 has drain and gate terminals coupled together to a gate terminal of n-channel transistor M11, and source terminals of n-channel transistors M10 and M11 are coupled to a common potential (e.g., GROUND). N-channel transistor M11 has a drain terminal coupled to a first terminal of variable resistor RV.

Variable resistor RV has a second terminal coupled to a first terminal of dummy word line driver 1130, and a series of selectable taps coupled to non-inverting input node Vin of opamp 1128. Optional dummy word line driver 1130 has a second terminal coupled to a reference voltage node VREF. Dummy word line driver 1130 includes parallel-coupled transistors M1 and M2, such as n-channel MOSFET transistors. Dummy word line driver 1130 is designed to substantially match word line driver 1112, and has a voltage drop Vdummy that is substantially equal to a voltage drop (VB−VA) across word line driver 1112

In an embodiment, control signal SELX has a first value (e.g., LOW) and a second value (e.g., HIGH). When control signal SELX is LOW, n-channel transistor M7 is OFF, p-channel transistor M8 is ON, and conductor 1124 is coupled to unselected word line voltage node VUX. When control signal SELX is HIGH, n-channel transistor M7 is ON and p-channel transistor M8 is OFF. Ignoring any voltage drop across conductor 1124 and the drain-to-source voltage of n-channel transistor M7, when control signal SELX is HIGH, selected word line voltage node VSX equals the voltage at noded V1, which equals the voltage Vin.

In addition, when control signal ENSELX and SELX are both HIGH, selected word line comb 1100 is coupled to selected word line voltage node VSX. Ignoring any voltage drop across conductor 1124 and the drain-to-source voltage of n-channel transistor M7, the voltage at selected word line voltage node VSX equals the voltage Vin.

Selected word line comb 1100 has a voltage Vcomb and conducts current I1 which is conducted by conductor 1110 and word line driver 1112, divided between conductor 1114 and n-channel transistor M3 and conductor 1118 and n-channel transistor M5, and coupled from word line voltage node VSX via conductor 1124 to n-channel transistors M7, M9 and M10.

N-channel transistors M10 and M11 form a current mirror. In an embodiment, the mirror ratio is 1:1, although other ratios may be used. N-channel transistor M10 conducts a current I1 and n-channel transistor M11 conducts a mirrored current I1*, with I1* substantially equal to I1. Current I1* is conducted by dummy word line driver 1130 and variable resistor RV.

The voltage Vin at non-inverting input node of opamp 1128 is:

$$Vin = VREF - Vdummy - (I1^* \times RV) \tag{1}$$

where Vdummy is the voltage drop across dummy word line driver 1130 and (I1*×RV) is the voltage drop across variable resistor RV. Variable resistor RV is an estimate of the resistance of the conductive paths between selected word line comb 1100 and selected word line voltage node VSX. Variable resistor RV may be expressed as:

$$RV \approx RB + RC // RD \tag{2}$$

Thus the voltage at selected word line voltage node VSX may be expressed as:

$$VSX = Vcomb - (VB - VA) - [I1 \times (RB + RC//RD)] \qquad (3)$$

Because the voltage at selected word line voltage node VSX also equals the voltage Vin, the voltage at selected word line voltage node VSX may be expressed as $$VSX = VREF - Vdummy - (I1^* \times RV) \qquad (4)$$

As described above, Vdummy substantially equals the voltage drop (VB−VA) across word line driver 1112 and current I1* substantially equals current I1. Combining equations (2), (3) and (4), selected word line comb 1100 has a voltage Vcomb≈VREF.

As described above, variable resistor RV is an estimate of the resistance of the conductive paths between selected word line comb 1100 and selected word line voltage node VSX. In an embodiment, variable resistor RV may be estimated based on one or more of the value of the selected word line current I1, a selected word line comb address, a measured sheet resistance of conductive material used to form conductors 1110, 1114 and 1118. Other factors also may be used to estimate of the resistance of the conductive paths between selected word line comb 1100 and selected word line voltage node VSX.

Thus, compensation circuit 1122a receives current I1 conducted by a selected word line comb 1100, estimates a resistance RV of the conductive path between selected word line comb 1100 and the selected word line voltage node VSX, and generates a voltage at the selected word line voltage node VSX based on the received current and the estimated resistance so that a voltage of selected word line comb 1100 substantially equals reference voltage VREF.

Figure 11B:
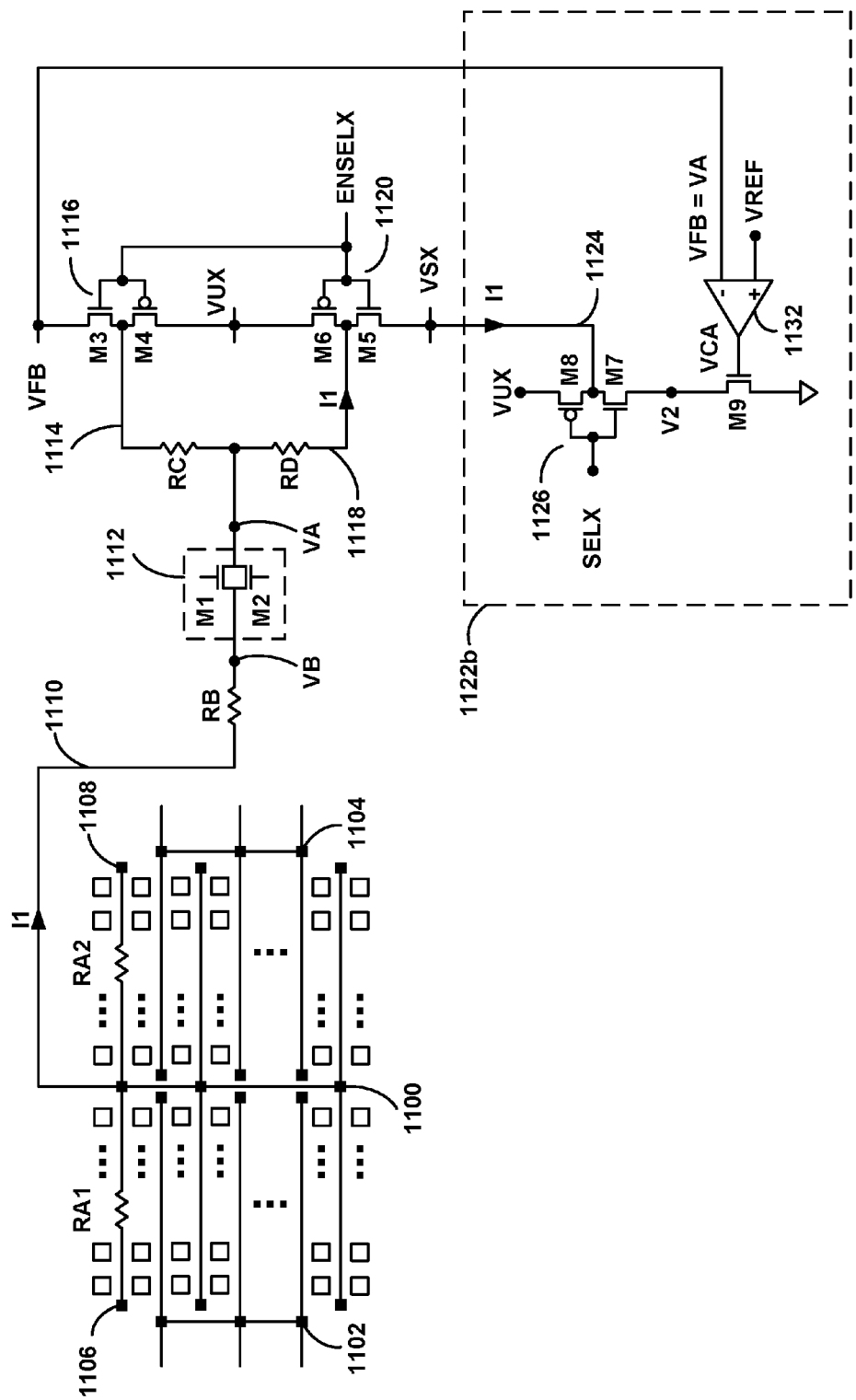

FIG. 11B is a diagram of another embodiment of a portion of a memory array, such as 3D memory array 100 of FIG. 1, coupled to driver circuitry and selector circuitry for selectively coupling word line combs to a selected word line voltage VSX and an unselected word line voltage VUX. As described in more detail below, FIG. 11B also includes a compensation circuit that provides voltage-sensing word line compensation.

The circuit of FIG. 11B is similar to that of FIG. 11A, except that in FIG. 11B, n-channel transistor M3 has a drain terminal coupled to a voltage feedback node VFB. In addition, the circuit of FIG. 11B includes a compensation circuit 1122b that provides voltage-sensing word line compensation. In particular, compensation circuit 1122b receives voltage feedback signal VFB which substantially equals a voltage of a node VA at an input terminal of word line driver 1112, and regulates selected word line current I1 so that node voltage VA substantially equals a reference voltage.

Compensation circuit 1122b includes conductor 1124 (having a resistance RE) coupled between selected word line voltage node VSX and a selector 1126. In an embodiment, selector 1126 includes an n-channel transistor M7 and a p-channel transistor M8. N-channel transistor M7 has a drain terminal coupled to a node V2, a gate terminal coupled to a control signal SELX, and a source terminal coupled to conductor 1124. P-channel transistor M8 has a drain terminal coupled to unselected word line voltage node VUX, a gate terminal coupled to control signal SELX, and a source terminal coupled to conductor 1124.

Compensation circuit 1122b also includes a comparator 1132 and an n-channel transistor M9. Comparator 1132 has a non-inverting input node coupled to reference voltage VREF, an inverting input node coupled to voltage feedback node VFB, and an output node VCA. N-channel transistor M9 has a drain terminal coupled to node V2, a gate terminal coupled to output node VCA, and a source terminal coupled to a common potential (e.g., GROUND).

In an embodiment, control signal ENSELX has a first value (e.g., LOW) and a second value (e.g., HIGH). When control signal ENSELX is LOW, n-channel transistors M3 and M5 are OFF, p-channel transistors M4 and M6 are ON, and conductors 1114 and 1118 are coupled to unselected word line voltage node VUX. When control signal ENSELX is HIGH, n-channel transistors M3 and M5 are ON, p-channel transistors M4 and M6 are OFF, conductor 1114 is coupled to voltage feedback node VFB and conductor 1118 is coupled to selected word line voltage node VSX.

Thus, word line driver 1112, selector 1120 and control signal ENSELX may be used to selectively couple word line comb 1100 to selected word line voltage node VSX (ENSELX=HIGH) and unselected word line voltage node VUX (ENSELX=LOW). When control signal ENSELX is HIGH, word line comb 1100 is a selected word line, and is referred to in this description as "selected word line comb 1100."

In an embodiment, control signal SELX has a first value (e.g., LOW) and a second value (e.g., HIGH). When control signal SELX is LOW, n-channel transistor M7 is OFF, p-channel transistor M8 is ON, and conductor 1124 is coupled to unselected word line voltage node VUX. When control signal SELX is HIGH, n-channel transistor M7 is ON, p-channel transistor M8 is OFF, and conductor 1124 is coupled to selected word line voltage node VSX.

In addition, when control signal ENSELX and SELX are both HIGH, selected word line comb 1100 is coupled to selected word line voltage node VSX. Selected word line comb 1100 conducts current I1, which is conducted by conductor 1110, word line driver 1112, conductor 1118 and n-channel transistor M5, and coupled from word line voltage node VSX via conductor 1124 to transistors M7 and M9. Conductor 1114 and n-channel transistor M3 conduct no current because voltage feedback node VFB is coupled into the high impedance inverting input node of comparator 1132. Thus, voltage feedback signal VFB substantially equals node voltage VA at input terminal VA of word line driver 1112.

Comparator 1132 compares voltage feedback signal VFB=VA with reference voltage VREF, and generates control voltage VCA which drives the gate of n-channel transistor M9. The feedback loop tends to regulate node voltage VA so that VA=VREF. In particular, if node voltage VA starts to drop below reference voltage VREF, control voltage VCA increases, which increases selected word line current I1, and thus increases node voltage VA. If node voltage VA starts to increase above reference voltage VREF, control voltage VCA decreases, which decreases selected word line current I1, and thus decreases node voltage VA.

Figure 11C:
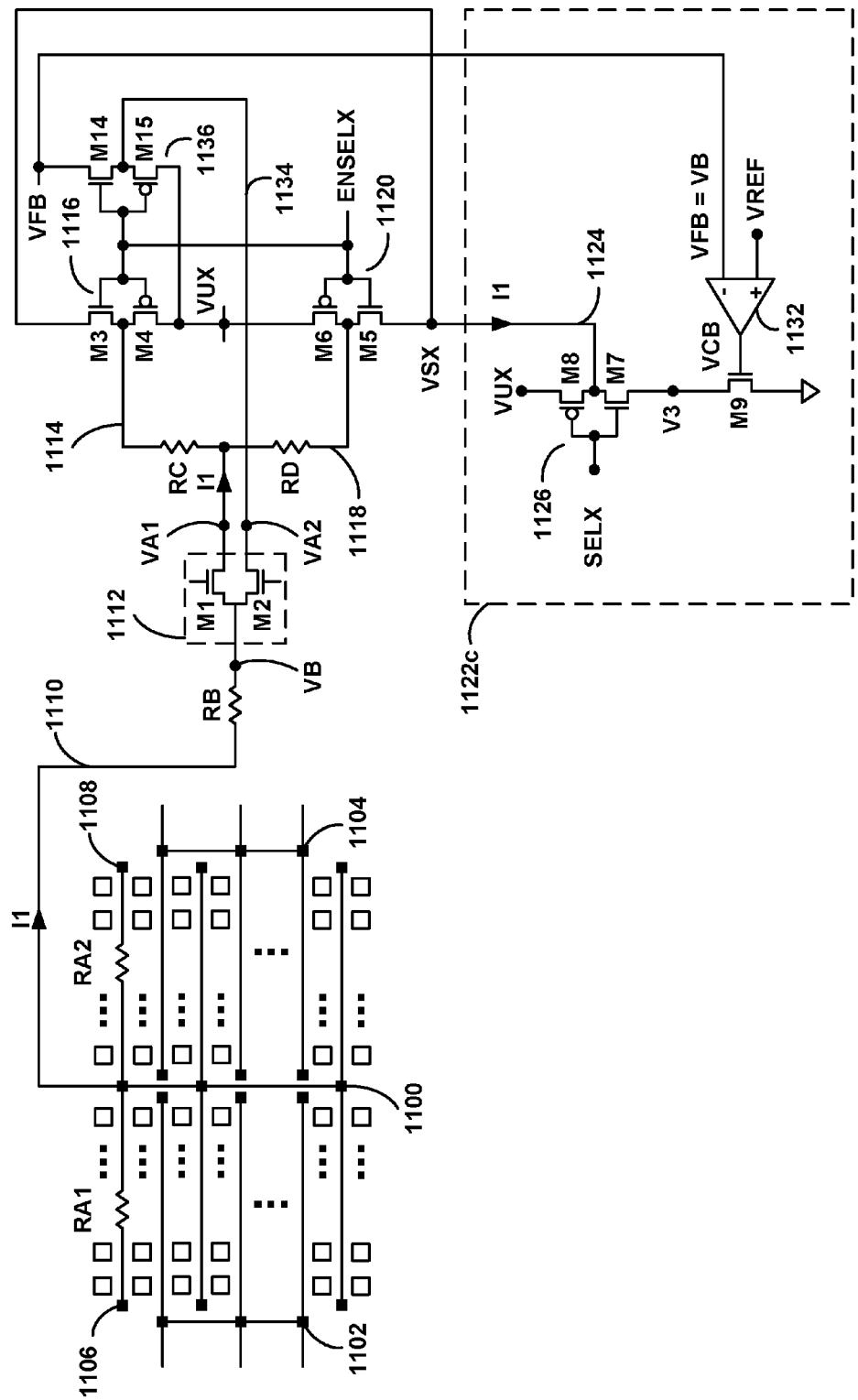

FIG. 11C is a diagram of another embodiment of a portion of a memory array, such as 3D memory array 100 of FIG. 1, coupled to driver circuitry and selector circuitry for selectively coupling word line combs to a selected word line voltage VSX and an unselected word line voltage VUX. As described in more detail below, FIG. 11C also includes a compensation circuit that provides voltage-sensing word line compensation.

The circuit of FIG. 11C is similar to that of FIG. 11A, except that in FIG. 11C, word line driver 1112 includes a first input terminal VA1 coupled to a drain terminal of n-channel transistor M1, and a second input terminal VA2 coupled to a drain terminal of n-channel transistor M2. Second input terminal VA2 is coupled via a conductor 1134 to a selector 1136. In an embodiment, selector 1136 includes an n-channel transistor M14 and a p-channel transistor M15. N-channel transistor M14 has a drain terminal coupled to voltage feedback node VFB, a gate terminal coupled to a control signal ENSELX, and a source terminal coupled to conductor 1134. P-channel transistor M15 has a drain terminal coupled to an unselected word line voltage node VSX, a gate terminal coupled to control signal ENSELX, and a source terminal coupled to conductor 1134.

In addition, the circuit of FIG. 11C includes a compensation circuit 1122c that provides voltage-sensing word line compensation. In particular, compensation circuit 1122c receives voltage feedback signal VFB which substantially equals a voltage VB at an output terminal of word line driver 1112, and regulates selected word line current I1 so that voltage VB substantially matches a desired reference voltage.

Compensation circuit 1122c includes conductor 1124 (having a resistance RE) coupled between selected word line voltage node VSX and a selector 1126. In an embodiment, selector 1126 includes an n-channel transistor M7 and a p-channel transistor M8. N-channel transistor M7 has a drain terminal coupled to a node V3, a gate terminal coupled to a control signal SELX, and a source terminal coupled to conductor 1124. P-channel transistor M8 has a drain terminal coupled to unselected word line voltage node VUX, a gate terminal coupled to control signal SELX, and a source terminal coupled to conductor 1124.

Compensation circuit 1122c also includes comparator 1132 and n-channel transistor M9. Comparator 1132 has a non-inverting input node coupled to reference voltage VREF, an inverting input node coupled to voltage feedback node VFB, and an output node VCB. N-channel transistor M9 has a drain terminal coupled to node V3, a gate terminal coupled to output node VCB, and a source terminal coupled to a common potential (e.g., GROUND).

In an embodiment, control signal ENSELX has a first value (e.g., LOW) and a second value (e.g., HIGH). When control signal ENSELX is LOW, n-channel transistors M3, M5 and M14 are OFF, p-channel transistors M4, M6 and M15 are ON, and conductors 1114 and 1118 are coupled to unselected word line voltage node VUX. When control signal ENSELX is HIGH, n-channel transistors M3, M5 and M14 are ON, p-channel transistors M4, M6 and M15 are OFF, conductors 1114 and 1118 are coupled to selected word line voltage node VSX, and conductor 1134 is coupled to voltage feedback node VFB.

Thus, n-channel transistor M1 of word line driver 1112, selectors 1116 and 1120 and control signal ENSELX may be used to selectively couple word line comb 1100 to selected word line voltage node VSX (ENSELX=HIGH) and unselected word line voltage node VUX (ENSELX=LOW). When control signal ENSELX is HIGH, word line comb 1100 is a selected word line, and is referred to in this description as "selected word line comb 1100."

In an embodiment, control signal SELX has a first value (e.g., LOW) and a second value (e.g., HIGH). When control signal SELX is LOW, n-channel transistor M7 is OFF, p-channel transistor M8 is ON, and conductor 1124 is coupled to unselected word line voltage node VUX. When control signal SELX is HIGH, n-channel transistor M7 is ON, p-channel transistor M8 is OFF, and conductor 1124 is coupled to selected word line voltage node VSX.

In addition, when control signal ENSELX and SELX are both HIGH, selected word line comb 1100 is coupled to selected word line voltage node VSX. Selected word line comb 1100 conducts current I1, which is conducted by conductor 1110 and n-channel transistor M1 of word line driver 1112, is divided between conductor 1114 and n-channel transistor M3 and conductor 1118 and n-channel transistor M5, and is coupled from word line voltage node VSX via conductor 1124 to transistors M7 and M9. Conductor 1134 and n-channel transistor M14 conduct no current because voltage feedback node VFB is coupled into the high impedance inverting input node of comparator 1132. Thus, voltage feedback signal VFB substantially equals voltage VB at output terminal VB of word line driver 1112.

Comparator 1132 compares voltage feedback signal VFB=VB with reference voltage VREF, and generates control voltage VCB which drives the gate of n-channel transistor M9. The feedback loop tends to regulate VB so that VB=VREF. In particular, if voltage VB starts to drop below reference voltage VREF, control voltage VCB increases, which increases selected word line current I1, and thus increases voltage VB. If voltage VB starts to increase above reference voltage VREF, control voltage VCB decreases, which decreases selected word line current I1, and thus decreases voltage VB.

One embodiment of the disclosed technology includes a method for operating a non-volatile storage system that includes a plurality of bit lines, a word line comb including a plurality of word lines, and a plurality of memory elements, each memory element coupled between one of the bit lines and one of the word lines. The method includes receiving a current conducted by the word line comb, estimating a resistance of a conductive path between the word line comb and a selected word line voltage node, and generating a voltage at the selected word line voltage node based on the received current and the estimated resistance so that a voltage of the word line comb substantially equals a reference voltage.

One embodiment of the disclosed technology includes a non-volatile storage system that includes a memory array and a compensation circuit in communication with the memory array. The memory array includes a plurality of bit lines, a word line comb including a plurality of word lines, and a plurality of rewriteable non-volatile memory cells, each of the plurality of rewriteable non-volatile memory cells coupled between one of the bit lines and one of the word lines. The compensation circuit is configured to receive a current conducted by the word line comb, estimate a resistance of a conductive path between the word line comb and a selected word line voltage node, and generate a voltage at the selected word line voltage node based on the received current and the estimated resistance so that a voltage of the word line comb substantially equals a reference voltage.

One embodiment of the disclosed technology includes a method for operating a non-volatile storage system including a plurality of bit lines, a word line comb including a plurality of word lines, and a plurality of memory elements, each memory element coupled between one of the bit lines and one of the word lines. The method includes receiving a voltage feedback signal that substantially equals a voltage of a node coupled to the word line comb, and regulating a current conducted by the word line comb so that the node voltage substantially equals a reference voltage.

One embodiment of the disclosed technology includes a non-volatile storage system that includes a memory array and a compensation circuit means in communication with the memory array. The memory array includes a plurality of bit lines, a word line comb including a plurality of word lines, and a plurality of rewriteable non-volatile memory cells, each of the plurality of rewriteable non-volatile memory cells coupled between one of the bit lines and one of the word lines. The compensation circuit means is configured to receive a current conducted by the word line comb, estimate a resistance of a conductive path between the word line comb and a selected word line voltage node, and generate a voltage at the selected word line voltage node based on the received current and the estimated resistance so that a voltage of the word line comb substantially equals a reference voltage.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method for operating a non-volatile storage system comprising a plurality of bit lines, a word line comb comprising a plurality of word lines, and a plurality of memory elements, each memory element coupled between one of the bit lines and one of the word lines, the method comprising:
    receiving a current conducted by the word line comb, the current comprising a sum of currents conducted by the word lines;
    estimating a resistance of a conductive path between the word line comb and a selected word line voltage node; and
    generating a voltage at the selected word line voltage node based on the received current and the estimated resistance so that a voltage of the word line comb substantially equals a reference voltage.

2. The method of claim 1, wherein the memory elements comprise resistance-switching memory elements.

3. The method of claim 1, wherein estimating a resistance is based on one or more of a value of the received current, an address of the word line comb, and a measured sheet resistance of conductive material used to form the conductive path between the word line comb and the selected word line voltage node.

4. The method of claim 1, further comprising using a variable resistor to select a resistor value that estimates a resistance of a conductive path between the word line comb and a selected word line voltage node.

5. The method of claim 1, wherein a word line driver is coupled between the word line comb and the selected word line voltage node, and the method further comprises generating a voltage at the selected word line voltage node based on the received current, the estimated resistance, and a voltage that substantially equals a voltage drop across the word line driver so that the voltage of the word line comb substantially equals a reference voltage.

6. The method of claim 1, further comprising:
    generating a mirrored current proportional to the received current; and
    generating a voltage at the selected word line voltage node based on the mirrored current and the estimated resistance so that a voltage of the word line comb substantially equals a reference voltage.

7. The method of claim 1, wherein the nonvolatile storage system comprises a non-volatile memory that is monolithically formed in one or more physical levels of memory cells having active areas disposed above a silicon substrate.

8. A non-volatile storage system, comprising:
    a memory array comprising a plurality of bit lines, a word line comb comprising a plurality of word lines, and a plurality of rewriteable non-volatile memory cells, each of the plurality of rewriteable non-volatile memory cells coupled between one of the bit lines and one of the word lines; and
    a compensation circuit in communication with the memory array, the compensation circuit configured to:
        receive a current conducted by the word line comb, the current comprising a sum of currents conducted by the word lines;
        estimate a resistance of a conductive path between the word line comb and a selected word line voltage node; and
        generate a voltage at the selected word line voltage node based on the received current and the estimated resistance so that a voltage of the word line comb substantially equals a reference voltage.

9. The non-volatile storage system of claim 8, wherein the compensation circuit comprises:
    a unity gain amplifier having an input node and an output node coupled to the selected word line voltage node;
    a current mirror circuit coupled to the selected word line voltage node, the current mirror circuit generating a mirrored current that is substantially equal to the received current;
    a variable resistor coupled to the reference voltage, the current mirror and the input node of the unity gain amplifier, the variable resistor conducting the mirrored current and having a resistance substantially equal to the resistance of the conductive path between the word line comb and a selected word line voltage node.

10. The non-volatile storage system of claim 9, wherein the memory array further comprises a word line driver disposed between the word line comb and the selected word line voltage node, and wherein the compensation circuit further comprises a dummy word line driver coupled between the reference voltage and the variable resistor.

11. A non-volatile storage system, comprising:
    a memory array comprising a plurality of bit lines, a word line comb comprising a plurality of word lines, and a plurality of rewriteable non-volatile memory cells, each of the plurality of rewriteable non-volatile memory cells coupled between one of the bit lines and one of the word lines; and
    a compensation circuit means in communication with the memory array, the compensation circuit means configured to:
        receive a current conducted by the word line comb, the current comprising a sum of currents conducted by the word lines;
        estimate a resistance of a conductive path between the word line comb and a selected word line voltage node; and
        generate a voltage at the selected word line voltage node based on the received current and the estimated resistance so that a voltage of the word line comb substantially equals a reference voltage.

12. The non-volatile storage system of claim 11, wherein the compensation circuit means comprises:

a unity gain amplifier means having an input node and an output node coupled to the selected word line voltage node;

a current mirror circuit means coupled to the selected word line voltage node, the current mirror circuit means generating a mirrored current that is substantially equal to the received current;

a variable resistor means coupled to the reference voltage, the current mirror means and the input node of the unity gain amplifier means, the variable resistor means conducting the mirrored current and having a resistance substantially equal to the resistance of the conductive path between the word line comb and a selected word line voltage node.

13. The non-volatile storage system of claim 12, wherein the memory array further comprises a word line driver means disposed between the word line comb and the selected word line voltage node, and wherein the compensation circuit means further comprises a dummy word line driver means coupled between the reference voltage and the variable resistor means.

14. The non-volatile storage system of claim 12, wherein the rewriteable non-volatile memory cells comprise resistance-switching memory elements.

15. The non-volatile storage system of claim 8, wherein the rewriteable non-volatile memory cells comprise resistance-switching memory elements.

16. The non-volatile storage system of claim 8, comprising a non-volatile memory that is monolithically formed in one or more physical levels of memory cells having active areas disposed above a silicon substrate.

17. A method for operating a non-volatile storage system comprising a plurality of bit lines, a word line comb comprising a plurality of word lines, and a plurality of memory elements, each memory element coupled between one of the bit lines and one of the word lines, the method comprising:

receiving a voltage feedback signal that substantially equals a voltage of a node coupled to the word line comb; and regulating a current conducted by the word line comb so that the node voltage substantially equals a reference voltage, the current comprising a sum of currents conducted by the word lines.

18. The method of claim 17, wherein the wherein the nonvolatile storage system further comprises a word line driver disposed between the word line comb and the a selected word line voltage node, and the node voltage comprises a voltage at an input node or an output node of the word line driver.

19. The method of claim 17, wherein the memory elements comprise resistance-switching memory elements.

20. The method of claim 17, wherein the nonvolatile storage system comprises a non-volatile memory that is monolithically formed in one or more physical levels of memory cells having active areas disposed above a silicon substrate.

* * * * *